(12) United States Patent
Motz et al.

(10) Patent No.: US 11,846,962 B2
(45) Date of Patent: Dec. 19, 2023

(54) BANDGAP REFERENCE CIRCUIT

(71) Applicant: Infineon Technologies AG, Neubiberg (DE)

(72) Inventors: Mario Motz, Wernberg (AT); Francesco Polo, Arnoldstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/740,589

(22) Filed: May 10, 2022

(65) Prior Publication Data

US 2022/0374037 A1 Nov. 24, 2022

(30) Foreign Application Priority Data

May 17, 2021 (DE) .......................... 102021112735.1

(51) Int. Cl.
*H02M 3/26* (2006.01)
*G05F 3/26* (2006.01)
(Continued)

(52) U.S. Cl.
CPC .............. *G05F 3/267* (2013.01); *G05F 3/20* (2013.01); *G05F 3/22* (2013.01); *G05F 3/26* (2013.01); *H03F 3/45475* (2013.01)

(58) Field of Classification Search
CPC ... G05F 3/267; G05F 3/20; G05F 3/22; G05F 3/26; H03F 3/45475
See application file for complete search history.

(56) References Cited

U.S. PATENT DOCUMENTS 5,120,994 A * 6/1992 Joly .......................... G05F 3/20
 327/542
5,568,045 A * 10/1996 Koazechi ................ G05F 3/267
 323/314
(Continued)

FOREIGN PATENT DOCUMENTS

CN 101788835 B 12/2011
CN 107091695 A 8/2017
(Continued)

OTHER PUBLICATIONS

B. S. Song and P. R. Gray. "A precision curvature-compensated CMOS bandgap reference." IEEE Journal of Solid-State Circuits. vol. 18. No. 6. pp. 634-643. Dec. 1983. doi: 10.1109/JSSC.1983.1052013.

(Continued)

*Primary Examiner* — Jue Zhang
*Assistant Examiner* — Lakaisha Jackson
(74) *Attorney, Agent, or Firm* — Harrity & Harrity, LLP (57) ABSTRACT

A bandgap reference circuit includes a bandgap reference core circuit that includes a first bipolar transistor having a first emitter current density and a first base-emitter voltage, a second bipolar transistor having a second emitter current density that is smaller than the first emitter current density and having a second base-emitter voltage, a resistor that is connected to the emitter of the second bipolar transistor, and a differential amplifier circuit that is configured to control first and second emitter currents through the first and second bipolar transistors, respectively, such that a sum of the second base-emitter voltage and a voltage drop across the resistor approximates the first base-emitter voltage. The bandgap reference circuit further includes a first replica bipolar transistor that emulates an operating point of the first (Continued)

bipolar transistor and a second replica bipolar transistor that emulates an operating point of the second bipolar transistor.

17 Claims, 9 Drawing Sheets

(51) Int. Cl.
    *H03F 3/45* (2006.01)
    *G05F 3/20* (2006.01)
    *G05F 3/22* (2006.01)

(56) References Cited

U.S. PATENT DOCUMENTS

| | | | |
|---|---|---|---|
| 6,198,267 B1 | 3/2001 | Bakker et al. | |
| 11,300,989 B1* | 4/2022 | Shu | H03K 17/22 |
| 2004/0245975 A1* | 12/2004 | Tran | G05F 3/30 |
| | | | 323/313 |
| 2010/0007324 A1 | 1/2010 | Masson et al. | |

FOREIGN PATENT DOCUMENTS

| | | |
|---|---|---|
| DE | 4111103 A1 | 10/1992 |
| DE | 102015202520 A1 | 10/2015 |

OTHER PUBLICATIONS

M. A. P. Pertijs, et al, "A CMOS smart temperature sensor with a 3/spl sigma/ inaccuracy of /spl plusmn/0.1/spl deg/C from -55/spl deg/C to 125/spl deg/C." IEEE Journal of Solid-State Circuits. vol. 40. No. 12. pp. 2805-2815. Dec. 2005. doi: 10.1109/JSSC.2005. 858476.

M. Motz, et al. "Compensation of Mechanical Stress-Induced Drift of Bandgap References With On-Chip Stress Sensor." IEEE Sensors Journal. vol. 15. No. 9. pp. 5115-5121. Sep. 2015. doi: 10.1109/ JSEN.2015.2433292.

* cited by examiner

BANDGAP REFERENCE CIRCUIT

RELATED APPLICATION

This application claims priority to German Patent Application No. 102021112735.1, filed on May 17, 2021, which is incorporated herein by reference in its entirety.

FIELD

The present disclosure relates to bandgap reference circuits and in particular to bandgap reference circuits for compensating for temperature drift and/or component drift.

BACKGROUND

Bandgap reference is the name given to a reference voltage source whose output voltage, in the temperature-compensated state, corresponds to the bandgap voltage of a semiconductor. The voltage that is generated thus varies depending on the semiconductor material. One particular property of a bandgap reference is high precision accompanied by low outlay in terms of circuitry. Bandgap references are additionally stable in terms of temperature and have a low terminal voltage (<3 volts). The circuit has accordingly become widespread in electronics and is used for example in magnetic position sensors, battery monitoring ICs or oscillators. Bandgap references are also commonly used in integrated mixed-signal circuits (ICs).

In the case of a bandgap reference, it is possible to achieve low temperature drift by adding a proportional-to-absolute-temperature (PTAT) voltage to the base-emitter voltage of a bipolar transistor (BJT). However, process variations mean that both a room temperature bandgap voltage and its temperature coefficient drift significantly from their nominal values over the lifetime of a bandgap reference. In a standard CMOS process (CMOS=Complementary metal-oxide-semiconductor), the resulting variation in the reference voltage may amount to several percent.

This constitutes a general restriction for the accuracy (over the lifetime) of bandgap references that are typically used in CMOS technology.

There is therefore a need for improved bandgap references.

SUMMARY

This need is addressed by devices and methods as claimed in the independent claims. Advantageous developments are the subject matter of the dependent claims.

According to a first aspect of the present disclosure, what is proposed is a bandgap reference circuit. The bandgap reference circuit includes a bandgap reference core circuit (bandgap core). The bandgap reference core circuit includes a first bipolar transistor having a first emitter current density and a first base-emitter voltage. The bandgap reference core circuit includes a second bipolar transistor having a second emitter current density that is smaller than the first emitter current density and having a second base-emitter voltage. The bandgap reference core circuit includes a resistor that is connected to the emitter of the second bipolar transistor (having the lower emitter current density). The bandgap reference core circuit furthermore includes a differential amplifier circuit that controls first and second emitter currents through the first and second bipolar transistor, such that a sum of the second base-emitter voltage and a voltage drop across the resistor approximates or ideally is equal to the first base-emitter voltage.

The bandgap reference circuit furthermore includes a first replica circuit that includes a first replica bipolar transistor. The first replica bipolar transistor emulates an operating point of the first bipolar transistor of the bandgap reference core circuit. In other words, the first replica bipolar transistor has the same emitter current density as the first bipolar transistor of the bandgap reference core circuit. The first replica circuit is configured such that it couples a base current of the first replica bipolar transistor to the emitter of the first bipolar transistor of the bandgap reference core circuit.

The bandgap reference circuit furthermore includes a second replica circuit that includes a second replica bipolar transistor. The second replica bipolar transistor emulates an operating point of the second bipolar transistor of the bandgap reference core circuit. In other words, the second replica bipolar transistor has the same emitter current density as the second bipolar transistor of the bandgap reference core circuit. The second replica circuit is configured such that it couples a base current of the second replica bipolar transistor to the emitter of the second bipolar transistor of the bandgap reference core circuit.

It is thus proposed to feed replica base currents into the emitters of the bipolar transistors of the bandgap reference core circuit, in order to cancel out a β-drift effect ($\beta = I_C/I_B$ denotes a current gain of a bipolar transistor) that is caused by different drifts of the collector currents of the bipolar transistors of the bandgap reference core circuit. To this end, the individual base currents of the bipolar transistors of the bandgap reference core circuit may be measured by way of the replica circuits. The replica base currents may then be fed back individually to the emitter of the bipolar transistors of the bandgap reference core circuit, in order to stabilize the collector current individually for each bipolar transistor of the bandgap reference core circuit and to make it independent of common or differential β-drift effects. The bipolar transistors of the bandgap reference core circuit are thus not driven by emitter currents, but rather driven by collector currents. What is thus proposed is individual (separate) β-compensation for the bipolar transistors of the bandgap reference core circuit. An aging effect caused by the PTAT voltage, the bandgap voltage and a sensitivity of sensors or an ADC reference may therefore turn out to be lower by a factor of 3 . . . 10.

According to some exemplary embodiments, the first bipolar transistor of the bandgap reference core circuit has a first emitter surface, and the (at least one) second bipolar transistor of the bandgap reference core circuit has a second emitter surface that is larger than the first emitter surface. The different emitter surfaces result in different emitter current densities. The different emitter surfaces may for example be formed by connecting a different number of (identical) base-emitter transitions in parallel.

As an alternative, a first emitter surface of the first bipolar transistor of the bandgap reference core circuit corresponds to a second emitter surface of the second bipolar transistor of the bandgap reference core circuit. The bandgap reference core circuit may have a first current source that delivers a first emitter current for the first bipolar transistor. The bandgap reference core circuit may furthermore have a second current source that delivers a second emitter current for the second bipolar transistor, wherein the second emitter current is lower than the first emitter current. Different current densities may thereby likewise be achieved.

According to some exemplary embodiments, the first bipolar transistor of the bandgap reference core circuit and the first replica bipolar transistor are each configured as pnp bipolar transistors. In an equivalent manner, the second bipolar transistor of the bandgap reference core circuit and the second replica bipolar transistor are each configured as pnp bipolar transistors. Parasitic pnp bipolar transistors are readily able to be manufactured in the course of CMOS manufacturing processes. Nevertheless, it will be obvious to a person skilled in the art that the principles of the present disclosure could likewise be implemented using npn bipolar transistors.

According to some exemplary embodiments, a base of the first replica bipolar transistor is coupled to the emitter of the first bipolar transistor of the bandgap reference core circuit. The first replica circuit may include a first optional metal-oxide semiconductor field-effect transistor (MOSFET) that is coupled between the first replica bipolar transistor and a current source of the first replica circuit. A base of the second replica bipolar transistor may be coupled to the emitter of the second bipolar transistor of the bandgap reference core circuit. The second replica circuit may include a second optional MOSFET that is coupled between the second replica bipolar transistor and a current source of the second replica circuit.

According to some exemplary embodiments, the first replica circuit includes a first current mirror that is coupled to a base of the first replica bipolar transistor. The first replica circuit may furthermore include a second current mirror that is coupled to the first current mirror. The second current mirror may have a first output that is coupled to the emitter of the first bipolar transistor of the bandgap reference core circuit. The second current mirror may furthermore have a second output that is coupled to the emitter of the first replica bipolar transistor and to a current source of the first replica circuit. The second replica circuit may have a first current mirror that is coupled to a base of the second replica bipolar transistor. The second replica circuit may have a second current mirror that is coupled to the first current mirror. The second current mirror may have a first output that is coupled to the emitter of the second bipolar transistor of the bandgap reference core circuit. The second current mirror may furthermore have a second output that is coupled to the emitter of the second replica bipolar transistor and to a current source of the second replica circuit. The base currents of the replica transistors made thus initially be mirrored and fed both into their own emitters and into the emitters of the transistors of the bandgap reference core circuit.

According to some exemplary embodiments, in which the bipolar transistors of the bandgap reference core circuit are in the form of pnp bipolar transistors, the first current mirrors are each in the form of NMOS current mirrors and the second current mirrors are each in the form of PMOS current mirrors. According to exemplary embodiments in which the bipolar transistors of the bandgap reference core circuit are in the form of npn bipolar transistors, the first current mirrors are each in the form of PMOS current mirrors and the second current mirrors are each in the form of NMOS current mirrors.

According to some exemplary embodiments, current sources of the replica circuits and of the bandgap reference core circuit are each controlled current sources and are each coupled to a control output of the differential amplifier circuit. The differential amplifier circuit thus delivers a control signal for the controlled current sources such that, due to the controlled emitter currents, a sum of the second base-emitter voltage (of the second bipolar transistor) and a voltage drop across the resistor approximates the first base-emitter voltage (of the first bipolar transistor).

According to some exemplary embodiments, the bandgap reference core circuit includes a first current source that is controlled by the differential amplifier circuit and that is designed to deliver a first emitter current. The bandgap reference core circuit may furthermore have a second current source that is controlled by the differential amplifier circuit and that is designed to deliver a second emitter current that is lower than the first emitter current. The bandgap reference core circuit may include a first dynamic element matching (DEM) circuit that is designed, in a first (chopper) switching phase, to couple the first bipolar transistor of the bandgap reference core circuit to the first (controlled) emitter current and to the first replica circuit and to couple the second bipolar transistor of the bandgap reference core circuit to the second (controlled) emitter current and to the second replica circuit. The first dynamic element matching circuit may furthermore be designed, in a second switching phase, to couple the first bipolar transistor of the bandgap reference core circuit to the second (controlled) emitter current and to the second replica circuit and to couple the second bipolar transistor of the bandgap reference core circuit to the first (controlled) emitter current and to the first replica circuit. The two bipolar transistors of the bandgap reference core circuit may be dimensioned identically, that is to say have identical base-emitter transition surfaces. The chopping or dynamic element matching (DEM) make it possible to suppress flicker noise and offsets caused by mismatching between the transistors, and to shift same into frequency ranges that are easily able to be filtered. Chopping and DEM may furthermore increase accuracy and lifetime stability and reduce scatter caused by local mismatching of paired transistors.

According to some exemplary embodiments, the bandgap reference circuit includes a second dynamic element matching circuit that is designed, in a first switching phase, to deliver the first emitter current by way of the first current source and to deliver the second emitter current by way of the second current source and, in a second switching phase, to deliver the first emitter current by way of the second current source and to deliver the second emitter current by way of the first current source. The second dynamic element matching circuit for the controlled current sources may operate dependently or else independently of the first dynamic element matching circuit for the bipolar transistors.

According to some exemplary embodiments, the bandgap reference circuit includes a third current source controlled by the differential amplifier circuit of the bandgap reference core circuit, a third bipolar transistor and a resistor that is coupled between the third current source and the emitter of the third bipolar transistor in order to obtain a bandgap voltage. The emitter of the third bipolar transistor may be coupled to the first or second replica circuit in order to couple a base current of the first or second replica bipolar transistor to the emitter of the third bipolar transistor. The third bipolar transistor is in this case dimensioned identically to the first and second bipolar transistor of the bandgap reference core circuit.

According to some exemplary embodiments, the bandgap reference circuit includes a fourth current source that is controlled by the differential amplifier circuit of the bandgap reference core circuit and that is designed to provide a proportional-to-absolute-temperature (PTAT) current.

According to some exemplary embodiments, the differential amplifier circuit of the bandgap reference core circuit is in the form of a chopper amplifier circuit whose inputs are coupled to different bipolar transistors of the bandgap reference core circuit in different switching phases. The chopping or dynamic element matching (DEM) make it possible to suppress flicker noise and offsets caused by mismatching between the transistors.

According to some exemplary embodiments, the first dynamic element matching circuit is designed, in the first switching phase, to couple the emitter of the first bipolar transistor of the bandgap reference core circuit to a first input of a chopper amplifier and to couple an output of the chopper amplifier to a second input of the chopper amplifier. The first dynamic element matching circuit is furthermore designed, in the second switching phase, to couple the emitter of the second bipolar transistor of the bandgap reference core circuit to the second input of the chopper amplifier and in the process to couple the output of the chopper amplifier to the first input of the chopper amplifier. A base-emitter voltage of the bipolar transistors of the bandgap reference core circuit may thus be obtained at the chopper amplifier. A resistor may be coupled between the output of the chopper amplifier and ground in order to be able to tap off this voltage.

According to some exemplary embodiments, the output of the chopper amplifier is coupled to a controlled current source in order to provide an NTAT (NTAT=negative-to-absolute-temperature) current.

According to some exemplary embodiments, the bandgap reference circuit includes a current source that is controlled by the differential amplifier circuit of the bandgap reference core circuit and that is designed to provide a PTAT current. It is thus possible to obtain a constant voltage that is substantially independent of temperature across a resistor connected between a circuit node in which the NTAT current and the PTAT current flow and ground.

BRIEF DESCRIPTION OF THE DRAWINGS

A few examples of devices and/or methods are explained in more detail below merely by way of example with reference to the appended figures, in which.

DETAILED DESCRIPTION

A few examples are now described in more detail with reference to the accompanying figures. Further possible examples are however not limited to the features of these embodiments that are described in detail. These may contain modifications to the features and equivalents and alternatives to the features. The terminology used herein to describe particular examples is furthermore not intended to be restrictive for further possible examples.

The same or similar reference signs relate throughout the description of the figures to the same or similar elements or features, which may each be implemented identically or else in a modified form, while providing the same or a similar function. In the figures, the thicknesses of lines, layers and/or regions may furthermore be exaggerated for clarification.

When two elements A and B are combined using an "or", this is to be understood to mean that all possible combinations are disclosed, i.e., only A, only B, and also A and B, unless individually expressly defined otherwise. "At least one of A and B" or "A and/or B" may be used as alternative wording for the same combinations. This applies equivalently to combinations of more than two elements.

If a singular form, e.g. "a, an" and "the", is used and the use only of a single element is defined as being neither explicitly nor implicitly binding, further examples may also use multiple elements to implement the same function. When a function is described in the following as being implemented using multiple elements, further examples may implement the same function using a single element or a single processing entity. Furthermore, it is understood that the terms "comprises", "comprising", "has" and/or "having" when used describe the presence of the indicated features, whole numbers, steps, operations, processes, elements, components and/or a group thereof, but do not in the process exclude the presence or the addition of one or more further features, whole numbers, steps, operations, processes, elements, components and/or a group thereof.

Figure 1A:
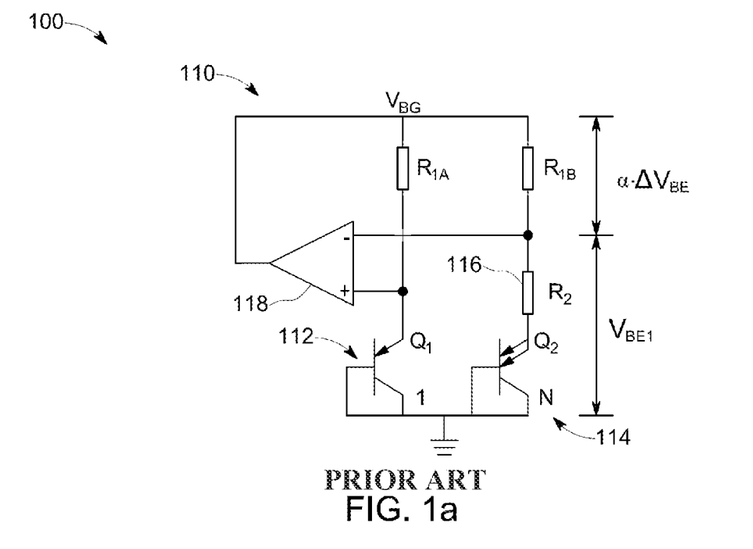
FIG. 1a shows a conventional bandgap reference circuit.
Figure 1B:
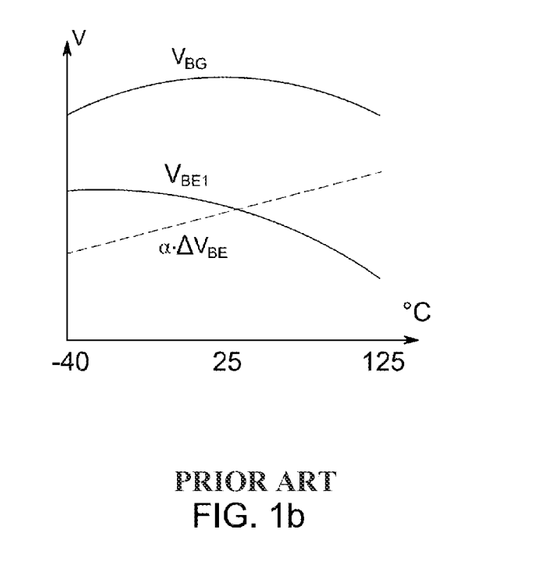
FIG. 1b shows a behavior of the conventional bandgap reference circuit 100.

FIG. 1a illustrates a typical CMOS bandgap reference circuit 100 is illustrated. FIG. 1b illustrates a behavior of the typical CMOS bandgap reference circuit 100.

The bandgap reference circuit 100 comprises a bandgap reference core circuit 110. The bandgap reference core circuit 110 comprises a first bipolar transistor (Q1) 112, which is connected between ground and a non-inverting input of a differential amplifier 118. The differential amplifier 118 may for example be in the form of an operational amplifier. The first bipolar transistor 112 has, by virtue of its first emitter surface, a first emitter current density and a first base-emitter voltage $V_{BE1}$. The bandgap reference core circuit 110 comprises a second bipolar transistor (Q2) 114, which is connected between ground and a resistor (R2) 116. The second bipolar transistor 114 has, by virtue of its second (larger) emitter surface, a second emitter current density that is smaller than the first emitter current density by a factor N, and a second base-emitter voltage $V_{BE2}$. A resistor (R2) 116 is connected to the emitter of the second bipolar transistor 114, on the one hand, and to an inverting input of the differential amplifier 118, on the other hand. The differential amplifier 118 controls the first and second emitter currents $I_{E1}$, $I_{E2}$ through the first and second bipolar transistor 112, 114 through the resistors $R_{1A}$ and $R_{1B}$, such that a sum of the second base-emitter voltage $V_{BE2}$ and a voltage drop $V_{PTAT} = \alpha \Delta V_{BE}$ across the resistor 116 approximates or ideally is equal to the first base-emitter voltage $V_{BE1}$. The voltage drop $V_{PTAT}$ across the resistor 116 is thus at least approximately proportional-to-absolute-temperature (PTAT, such that $V_{BE1} \approx V_{BE2} + V_{PTAT}$).

It is possible to produce bipolar transistors in any CMOS process. Vertical or lateral pnp bipolar transistors are for example able to be produced for n-well CMOS processes. However, it will be immediately obvious to a person skilled in the art that the bandgap reference circuits described in the present disclosure are not limited to pnp bipolar transistors, but rather that the principles described herein may also be implemented with npn bipolar transistors.

The bandgap voltage $V_{BG}$ at the output of the differential amplifier 118 is given by $$V_{BG} = V_{BE1} + \alpha \cdot \Delta V_{BE} = V_{BE1} + \frac{R_1}{R_2} V_T \ln N$$

wherein $\alpha = R_1/R_2$ is the resistance ratio between $R_1$ and $R_2$, $\Delta V_{BE} = V_T \ln N$ signifies the base-emitter voltage difference between the first and the second bipolar transistor 112, 114 and N signifies its emitter surface ratio. It has been assumed here, without restricting generality, that $R_{1A} = R_{1B} = R_1$.

Fault sources that impair the accuracy of the bandgap reference circuit 100 include a process variation of $V_{BE1}$, $\Delta V_{BE}$, an offset of the differential amplifier 118 and a non-linear temperature dependency of $V_{BE}$ (see FIG. 1b). The first two fault sources are primarily PTAT, while the last two are non-PTAT. While $\Delta V_{BE}$ is insensitive to the process variation, $V_{BE}$ depends on the absolute values both of the saturation current Is and of the current gains $\beta = I_C/I_B$ and will therefore scatter with variations in the IC process. Bandgap references having vertical pnp transistors with emitter current injections exhibit a lifetime drift of their collector currents $I_C$. This means that the two bipolar transistors 112, 114 may each develop different current gains $\beta = I_C/I_B$ over their lifetime, which may in turn lead to drifts or shifts of $V_{BG}$. This constitutes a general restriction for the accuracy (over the lifetime) of bandgap references that are typically used in CMOS technology.

The present disclosure proposes to compensate for or correct the different β-drifts of the bipolar transistors 112, 114 of the bandgap reference core circuit that are caused by different lifetime shifts of the respective collector currents $I_C$. To this end, the present disclosure proposes to use replica base currents in a bandgap reference circuit in order to compensate for a β-drift effect that is caused by different lifetime drifts of the collector currents of the two bipolar transistors 112, 114. The replica base currents for the bipolar transistors 112, 114 of the bandgap reference core circuit may be obtained using respectively associated replica circuits comprising respective replica bipolar transistors.

Figure 2:
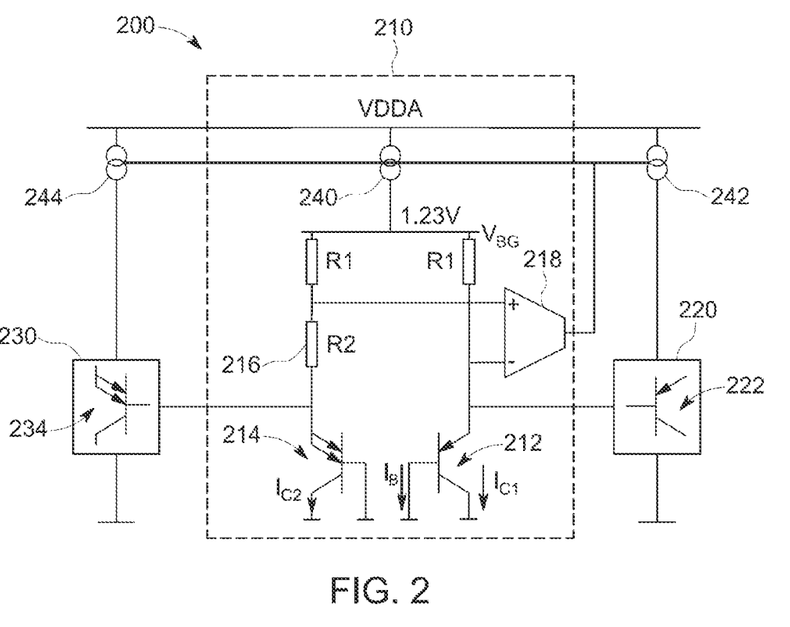
FIG. 2 shows a bandgap reference circuit according to a first exemplary embodiment.

FIG. 2 in this respect shows a schematic illustration of a bandgap reference circuit 200 having replica circuits according to the present disclosure.

The bandgap reference circuit 200 comprises a bandgap reference core circuit 210. The bandgap reference core circuit 210 comprises a first pnp bipolar transistor 212 having a first emitter current density and a first base-emitter voltage $U_{BE1}$. The bandgap reference core circuit 210 comprises a second pnp bipolar transistor 214 having a second emitter current density that is smaller than the first emitter current density and having a second base-emitter voltage $U_{BE2}$. The bandgap reference core circuit 210 comprises a resistor (R2) 216 that is connected to the emitter of the second bipolar transistor 214. The bandgap reference core circuit 210 furthermore comprises a differential amplifier circuit 218 that controls first and second emitter currents $I_{E1}$, $I_{E2}$ through the first and second bipolar transistor 212, 214, such that a sum of the second base-emitter voltage $U_{BE2}$ and a voltage drop across the resistor 216 approximates or ideally is equal to the first base-emitter voltage $U_{BE1}$. The differential amplifier circuit 218 may for example comprise an operational amplifier or a transconductance amplifier (operational transconductance amplifier, OTA).

The proposed bandgap reference circuit 200 furthermore comprises a first replica circuit 220 that comprises a first pnp replica bipolar transistor 222. The first replica bipolar transistor 222 emulates an operating point of the first bipolar transistor 212 of the bandgap reference core circuit 210. In other words, the first replica bipolar transistor 222 has the same emitter current density as the first bipolar transistor 212 of the bandgap reference core circuit 210. The first replica circuit 220 is configured such that it indirectly or directly couples a base current of the first replica bipolar transistor 222 to the emitter of the first bipolar transistor 212 of the bandgap reference core circuit 210.

The bandgap reference circuit 200 furthermore comprises a second replica circuit 230 that comprises a second pnp replica bipolar transistor 234. The second replica bipolar transistor 234 emulates an operating point of the second bipolar transistor 214 of the bandgap reference core circuit 210. In other words, the second replica bipolar transistor 234 has the same emitter current density as the second bipolar transistor 214 of the bandgap reference core circuit 210. The second replica circuit 230 is configured such that it indirectly or directly couples a base current of the second replica bipolar transistor 234 to the emitter of the second bipolar transistor 214 of the bandgap reference core circuit 210.

Emitter currents for the bandgap reference core circuit 210 and the replica circuits 220, 230 are provided here in each case by current sources 240, 242, 244 that are controlled by the differential amplifier circuit 218. Different emitter current densities may be achieved through varying emitter current injection by way of controlled current sources 240, 242, 244 and/or through different emitter surfaces of the bipolar transistors. The replica bipolar transistors behave in accordance with the bipolar transistors of the bandgap reference core circuit 210 that are assigned thereto, and thus deliver replica base currents in accordance with the base currents of the bipolar transistors of the bandgap reference core circuit 210.

It is thus proposed to feed replica base currents of the replica bipolar transistors into the emitters of the bipolar transistors of the bandgap reference core circuit 210 in order to cancel out a β-drift effect caused by different drifts of the collector currents of the bipolar transistors 212, 214 of the bandgap reference core circuit 210. To this end, the individual base currents of the bipolar transistors 212, 214 of the bandgap reference core circuit 210 may be measured by way of the replica circuits 220, 230. The base currents may then be fed back individually to the emitter of the bipolar transistors 212, 214 of the bandgap reference core circuit 210, in order to stabilize the collector current individually for each bipolar transistor 212, 214 of the bandgap reference core circuit 210 and to make it independent of common or differential β-drift effects. The bipolar transistors 212, 214 of the bandgap reference core circuit 210 are thus not driven by emitter currents, but rather driven by collector currents. What is thus proposed is individual (separate) β-compensation for the bipolar transistors of the bandgap reference core circuit. An aging effect caused by the PTAT voltage, the bandgap voltage and a sensitivity of sensors or an ADC reference may therefore turn out to be lower by a factor of 3 . . . 10.

Figure 3:
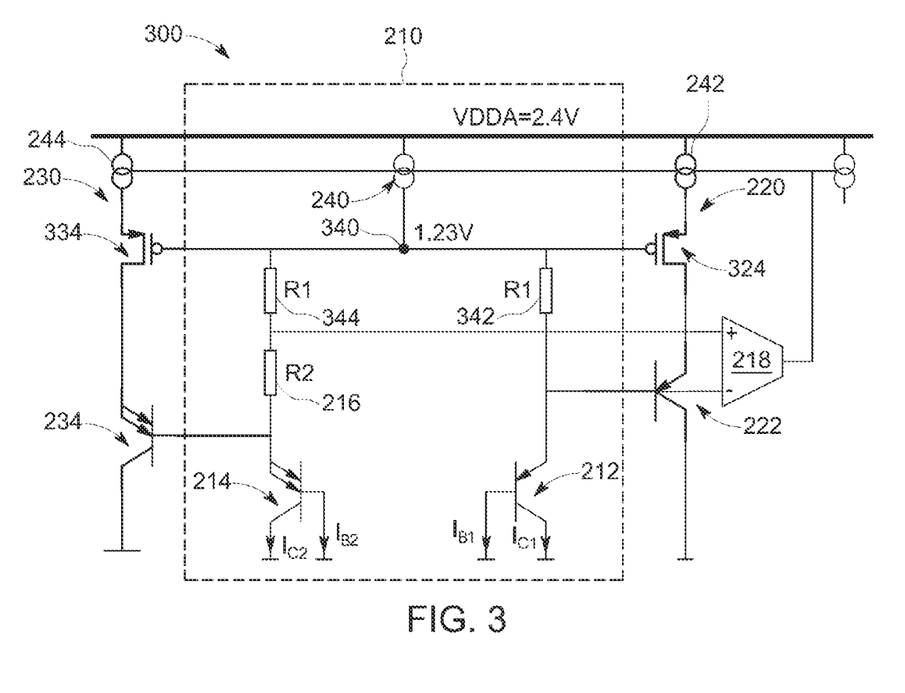
FIG. 3 shows a bandgap reference circuit according to a second exemplary embodiment.

A further exemplary embodiment of a bandgap reference circuit 300 is shown in FIG. 3.

The exemplary embodiment shown in FIG. 3 likewise comprises the bandgap reference core circuit 210 of FIG. 2. The first (pnp) bipolar transistor 212 of the bandgap reference core circuit 210 is connected between ground and an inverting input of the differential or operational amplifier 218. This means that the emitter connection of the first bipolar transistor 212 is connected to the inverting input of the differential amplifier 218, the collector connection of the first bipolar transistor 212 is connected to ground, and the base connection of the first bipolar transistor 212 is likewise connected to ground. A resistor (R1) 342 is connected between the emitter connection of the first bipolar transistor 212 and a circuit node 340. The controlled current source 240 is connected between the circuit node 340 and a supply potential. The second bipolar transistor 214 of the bandgap reference core circuit 210 is connected between ground and the resistor 216. This means that the emitter connection of the second bipolar transistor 214 is connected to the resistor 216, the collector connection of the second bipolar transistor 214 is connected to ground, and the base connection of the second bipolar transistor 214 is likewise connected to ground. A second connection of the resistor 216 is connected to the non-inverting input of the differential amplifier 218. A resistor 344 is coupled between the resistor 216 and the circuit node 340. Without restricting generality, the resistors 342 and 344 may be of substantially identical design. A multiplicity of controlled current sources may be driven by the differential amplifier 218. A first of the controlled current sources 340 is coupled between a reference potential and the circuit node 340, such that it is able to supply the bandgap reference core circuit 210 with emitter currents for the two bipolar transistors 212, 214.

A second current source 242 controlled by the differential amplifier 218 delivers an emitter current for the first replica bipolar transistor 222 of the first replica circuit 220. The collector connection of the first replica bipolar transistor 222 is connected to ground. The base connection of the first replica bipolar transistor 222 is coupled to the emitter connection of the first bipolar transistor 212 of the bandgap reference core circuit 210. The emitter connection of the first replica bipolar transistor 222 is connected to a drain connection of a first optional PMOS transistor 324 of the first replica circuit 220. The source connection of the first PMOS transistor 324 is connected to the controlled current source 242. The gate connection of the first PMOS transistor 324 is connected to the circuit node 340 of the bandgap reference core circuit 210.

A third current source 244 controlled by the differential amplifier 218 delivers an emitter current for the second replica bipolar transistor 234 of the second replica circuit 230. The collector connection of the second replica bipolar transistor 234 is connected to ground. The base connection of the second replica bipolar transistor 234 is coupled to the emitter connection of the second bipolar transistor 214 of the bandgap reference core circuit 210. The emitter connection of the second replica bipolar transistor 234 is connected to a drain connection of a second optional PMOS transistor 334 of the second replica circuit 230. The source connection of the second PMOS transistor 334 is connected to the controlled current source 354. The gate connection of the second PMOS transistor 334 is connected to the circuit node 340 of the bandgap reference core circuit 210.

In the exemplary embodiment shown in FIG. 3, the base currents of the replica bipolar transistors 222, 234 are fed directly into the respective emitter connections of the bipolar transistors 212, 214 of the bandgap reference core circuit 210. The two PMOS transistors 324, 334 are optional and could possibly also be omitted.

Figure 4:
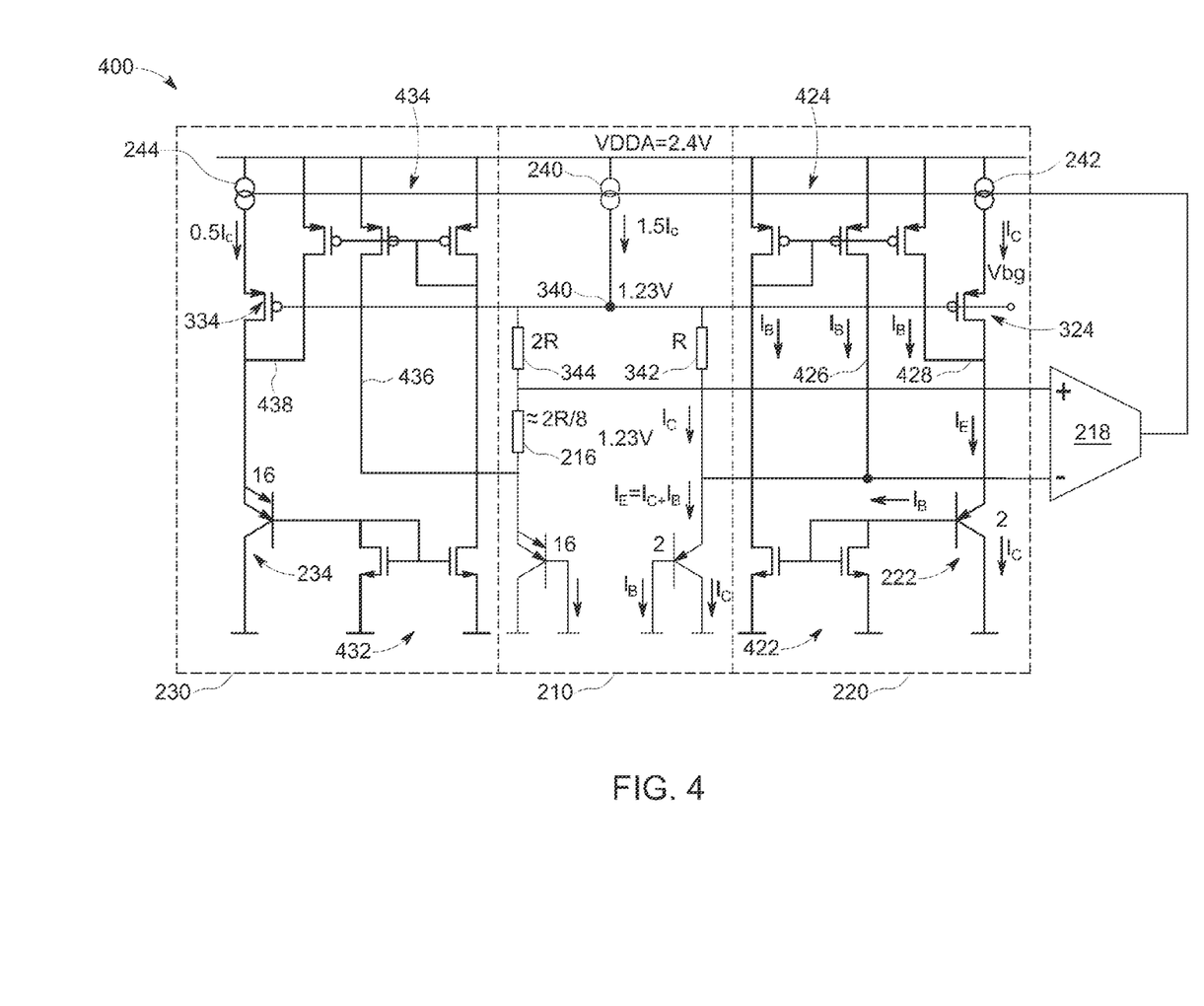
FIG. 4 shows a bandgap reference circuit according to a third exemplary embodiment.

FIG. 4 shows a further exemplary embodiment of a bandgap reference circuit 400.

The bandgap reference core circuit 210 of the bandgap reference circuit 400 does not differ from the bandgap reference core circuit from the previous exemplary embodiments. No further circuit details of the bandgap reference core circuit 210 are therefore given at this point.

In the exemplary embodiment shown in FIG. 4, the first replica circuit 220, assigned to the first bipolar transistor 212 of the bandgap reference core circuit 210, comprises a first current mirror 422 (at the bottom) that is connected to the base connection of the first replica bipolar transistor 222. In the exemplary embodiment shown here, the first current mirror 422 is an NMOS current mirror. The first replica circuit 220 furthermore comprises a second current mirror 424 (at the top) that is coupled to the first current mirror 422. In the exemplary embodiment that is shown, the second current mirror 424 is a PMOS current mirror. The second current mirror 424 comprises a first output 426 that is coupled to the emitter connection of the first bipolar transistor 212 of the bandgap reference core circuit 210 and the inverting input of the differential amplifier 218. The second current mirror 424 furthermore comprises a second output 428 that is coupled to the emitter connection of the first replica bipolar transistor 222 and to the current source 352 of the first replica circuit 220 via the optional PMOS transistor 324. The current mirrors 422, 424 are used to mirror the base current of the first replica bipolar transistor 222.

In the exemplary embodiment shown in FIG. 4, the second replica circuit 230, assigned to the second bipolar transistor 214 of the bandgap reference core circuit 210, comprises a first current mirror 432 (at the bottom) that is coupled to the base connection of the second replica bipolar transistor 234. In the exemplary embodiment shown here, the first current mirror 432 of the second replica circuit 230 is an NMOS current mirror. The second replica circuit 230 furthermore comprises a second current mirror 434 (at the top) that is coupled to the first current mirror 432. In the exemplary embodiment that is shown, the second current mirror 434 is a PMOS current mirror. The second current mirror 434 comprises a first output 436 that is connected to the emitter connection of the second bipolar transistor 214 of the bandgap reference core circuit 210. The second current mirror 434 furthermore comprises a second output 438 that is coupled to the emitter connection of the second replica bipolar transistor 234 and to the controlled current source 354 of the second replica circuit 230 via the PMOS transistor 334. The current mirrors 432, 434 are used to mirror the base current of the second replica bipolar transistor 234.

In the exemplary embodiment shown in FIG. 4, the base currents of the replica bipolar transistors 222, 234 are fed via the respective current mirrors, that is to say indirectly, into the respective emitter connections of the bipolar transistors 212, 214 of the bandgap reference core circuit 210. The two PMOS transistors 324, 334 are again optional and could therefore possibly also be omitted.

Exemplary embodiments may be combined with chopping and/or dynamic element matching (DEM). Chopping and dynamic element matching may suppress flicker noise and offsets caused by mismatching between the transistors, and may convert them into high-frequency residual ripple that is easily able to be filtered. Exemplary embodiments of bandgap reference circuits with chopping and DEM are shown in FIGS. 5 and 6.

Figure 5:
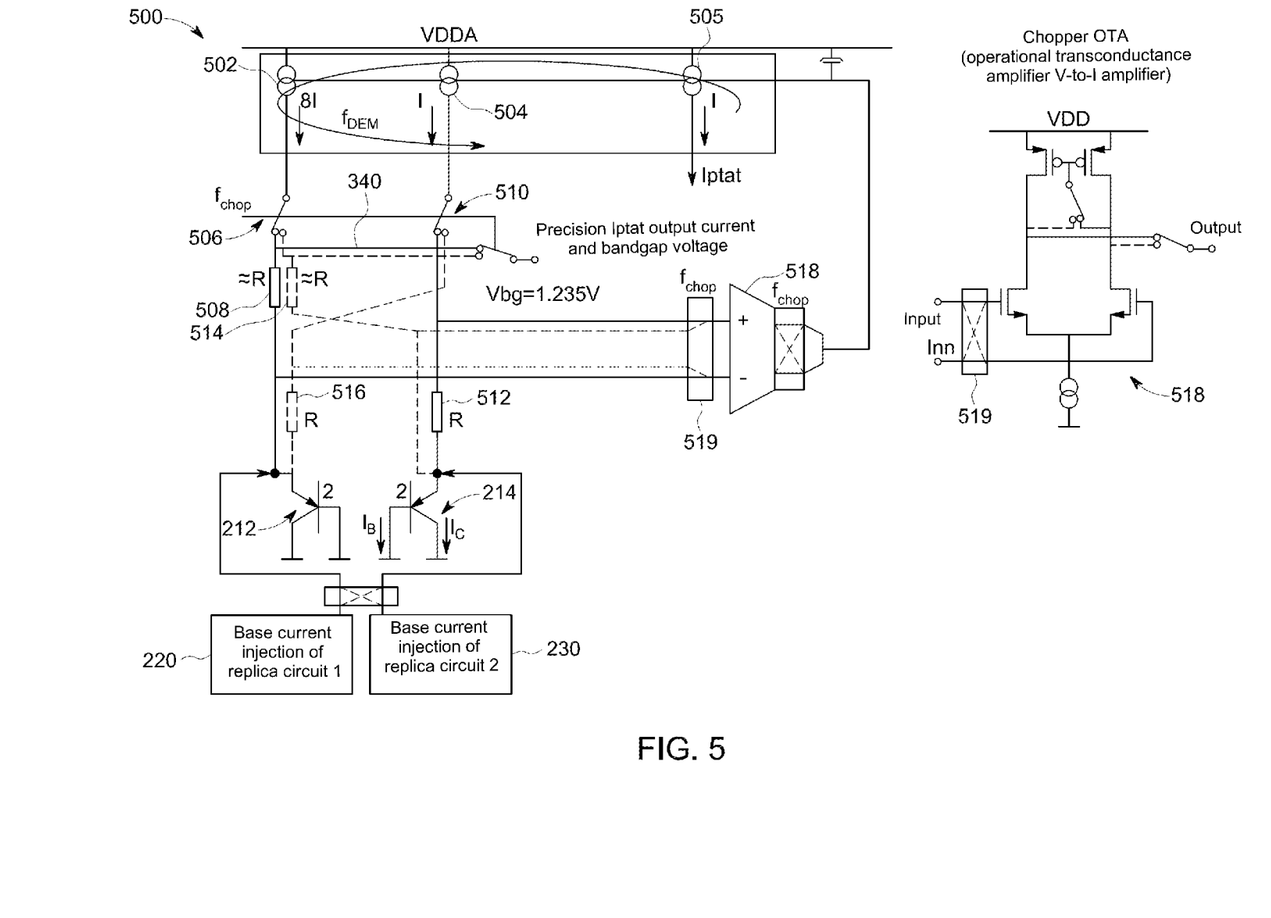
FIG. 5 shows a bandgap reference circuit according to a fourth exemplary embodiment.
Figure 6:
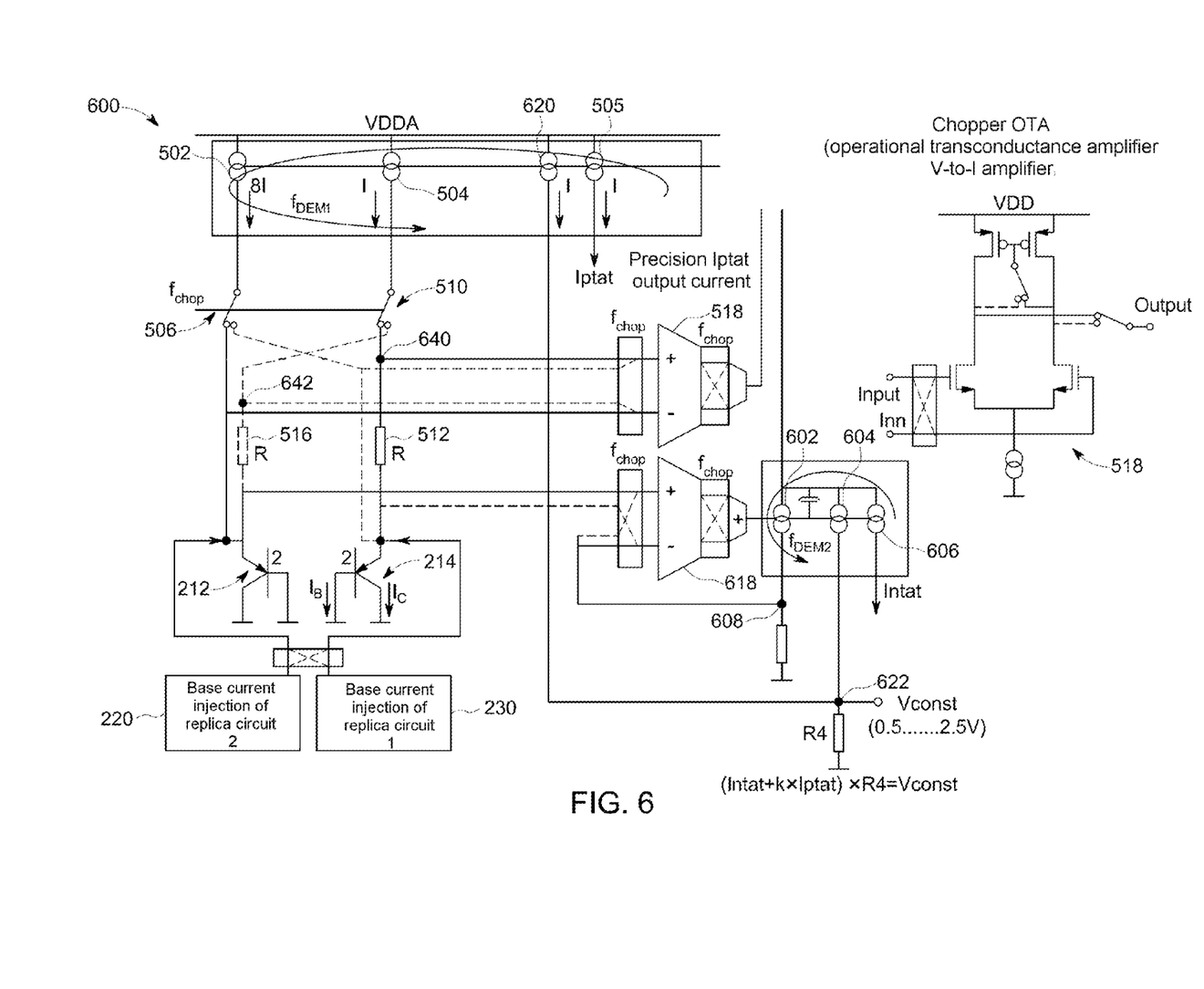
FIG. 6 shows a bandgap reference circuit according to a fifth exemplary embodiment.

In the bandgap reference circuit 500 illustrated in FIG. 5 with dynamic element matching, the bandgap reference core circuit 210 comprises a first current source 502 that is controlled by the differential amplifier or chopper amplifier 518 and that is designed to deliver a first emitter current (8I). The bandgap reference core circuit 210 furthermore comprises a second current source 504 that is controlled by the chopper amplifier 518 and that is designed to deliver a second emitter current (I) that is lower than the first emitter current. In the exemplary embodiment shown here, the emitter current densities are thus not controlled by the emitter surfaces of the first and second bipolar transistors 212, 214, but rather by the respective emitter current strengths. The emitter surfaces of the bipolar transistors 212, 214 of the bandgap reference core circuit 210 that are shown in FIG. 5 are substantially identical.

The bandgap reference circuit 500 comprises a dynamic element matching circuit (illustrated by various switches) that is designed, in a first (chopper) switching phase, to couple the first bipolar transistor 212 to the first emitter current and to the first (or the second) replica circuit 220 and to couple the second bipolar transistor 214 to the second emitter current and to the second replica circuit 230. In a second (chopper) switching phase, the dynamic element matching circuit couples the first bipolar transistor 212 to the second emitter current from the current source 504 and to the second (or the first) replica circuit 230. In an equivalent manner, in the second switching phase, the second bipolar transistor 214 is coupled to the first emitter current of the current source 502 and to the first replica circuit 220. The functions of the bipolar transistors 212, 214 are thus interchanged in the different switching phases.

The controlled current source 502 is coupled between a supply potential (VDDA) and a switch 506 of the dynamic element matching circuit, which switch is switched back and forth between two switch positions, that is to say two switching states, at a switching frequency $f_{chop}$. In a first switching phase, the switch 506 is in the position shown in FIG. 5 and connects the current source 502 to the emitter connection of the first bipolar transistor 212 via a resistor 508. During said first switching phase, the emitter connection of the first bipolar transistor 212 is coupled to the first replica circuit 220 in order to feed the base current of the first replica transistor into the first bipolar transistor 212 of the bandgap reference core circuit 210.

The second controlled current source 504 is coupled between the supply potential and a second switch 510 that is switched back and forth between two switch positions at the switching frequency $f_{chop}$. In the first switching phase, the switch 510 is in the position shown in FIG. 5 and connects the second current source 504 to the emitter connection of the second bipolar transistor 214 via a resistor 512. During the first switching phase, the emitter connection of the second bipolar transistor 214 is coupled to the second replica circuit 230 in order to feed the base current of the second replica transistor into the second bipolar transistor 214 of the bandgap reference core circuit 210.

During the first switching phase, the emitter connection of the first bipolar transistor 212 is coupled directly to the inverting input of the chopper amplifier 518. The circuit node 340 is connected to the non-inverting input of the chopper amplifier 518 during the first switching phase. One possible implementation of the chopper amplifier 518 as a transconductance amplifier with an input-side modulator 519 is shown on the right in FIG. 5.

In a second switching phase of the dynamic element matching circuit, the switches 506, 510 each change to the other of the two switch positions. In the second switching phase, the switch 506 connects the current source 502 to the emitter connection of the second bipolar transistor 214 and the non-inverting input of the chopper amplifier 518 via a resistor 514. During the second switching phase, the emitter connection of the second bipolar transistor 214 is coupled to the first replica circuit 220 in order to feed the base current of the first replica transistor into the second bipolar transistor 214 of the bandgap reference core circuit 210. This is possible in the exemplary embodiment that is shown because the bipolar transistors 212, 214 and the replica bipolar transistors 222, 234 are of substantially identical design.

In the second switching phase, the second switch 510 connects the second controlled current source 504 to the emitter connection of the first bipolar transistor 212 via a resistor 516. The circuit node 340 between current source 504 and resistor 516 is connected to the inverting input of the chopper amplifier 518. During the second switching phase, the emitter connection of the first bipolar transistor 212 is coupled to the second replica circuit 230 in order to feed the base current of the second replica transistor 234 into the first bipolar transistor 212 of the bandgap reference core circuit 210. This is possible in the exemplary embodiment that is shown because the bipolar transistors 212, 214 and the replica bipolar transistors 222, 234 are of substantially identical design.

In the exemplary embodiment shown in FIG. 5, the bipolar transistor 212, 214, connected in each case to the first controlled current source 502 in the different switching phases, acts as bipolar transistor having the higher emitter current density. In an equivalent manner, the bipolar transistor 212, 214, connected to the second controlled current source 504 in the respective switching phases, acts as bipolar transistor having the lower emitter current density. The dynamic element matching means that the functions of the assemblies are changed in the different switching phases, such that flicker noise and offsets caused by mismatching between the transistors are able to be suppressed. A highly accurate and stable bandgap voltage VBG is thus able to be tapped off at the circuit node 340. A third current source 518 controlled by way of the differential amplifier 218 may be used to obtain a highly accurate proportional-to-absolute-temperature (PTAT) current.

Optional dynamic element matching of the controlled current sources 502, 504 at a switching frequency $f_{DEM}$ may for example take place independently of the dynamic element matching of the bipolar transistors 212, 214 and the replica circuits 220, 230. Provision may thus be made for a second dynamic element matching circuit that is designed, in a first switching phase of the second dynamic element matching circuit, to deliver the first emitter current (8I) by way of the first current source 502 and to deliver the second emitter current (I) by way of the second current source 504 and, in a second switching phase of the second dynamic element matching circuit, to deliver the first emitter current (8I) by way of the second current source 504 and to deliver the second emitter current (I) by way of the first current source 502.

FIG. 6 shows one exemplary embodiment of a bandgap reference circuit 600 that is able to be used to provide an NTAT (NTAT=negative-to-absolute-temperature) current in addition to a PTAT current ($I_{ptat}$).

In a first switching phase of the dynamic element matching circuit, the switch 506 connects the current source 502 directly to the emitter connection of the first bipolar transistor 212. During the first switching phase, the emitter connection of the first bipolar transistor 212 is coupled to the first (or the second) replica circuit 220 in order to feed the base current of the first (or the second) replica bipolar transistor into the first bipolar transistor 212 of the bandgap reference core circuit 210. During the first switching phase, the emitter connection of the first bipolar transistor 212 is connected directly to the inverting input of the chopper amplifier 518 and directly to a non-inverting input of a second chopper amplifier 618. An output of the second chopper amplifier 618 is coupled back onto the inverting input of the second chopper amplifier 618 in the first switching phase. The output of the second chopper amplifier 618 controls three current sources 602, 604, 606, which each deliver an NTAT current ($I_{NTAT}$). An NTAT voltage is thus present at a circuit node 608 or the inverting input of the second chopper amplifier 618.

In the first switching phase, the second switch 510 is in the position shown in FIG. 6 and connects the second controlled current source 504 to the emitter connection of the second bipolar transistor 214 via the resistor 512. During the first switching phase, the emitter connection of the second bipolar transistor 214 is coupled to the second (or the first) replica circuit 230 in order to feed the base current of the second (or the first) replica transistor into the second bipolar transistor 214 of the bandgap reference core circuit 210. During the first switching phase, a circuit node 640 between switch 510 and resistor 512 is connected directly to the non-inverting input of the differential amplifier 218.

In a second switching phase of the dynamic element matching circuit, the switch 506 connects the current source 502 directly to the emitter connection of the second bipolar transistor 214 and directly to the non-inverting input of the first differential amplifier 218. During the second switching phase, the emitter connection of the second bipolar transistor 214 is coupled to the first (or the second) replica circuit 220 in order to feed the base current of the first (or the second) replica bipolar transistor into the second bipolar transistor 214 of the bandgap reference core circuit 210. During the second switching phase, the emitter connection of the second bipolar transistor 214 is connected directly to the inverting input of the second chopper amplifier 618. The output of the second chopper amplifier 618 is coupled back onto the non-inverting input of the second chopper amplifier 618 during the second switching phase.

In the second switching phase, the second switch 510 connects the second controlled current source 504 to the emitter connection of the first bipolar transistor 212 via the resistor 516. During the second switching phase, the emitter connection of the first bipolar transistor 212 is coupled to the second (or the first) replica circuit 220 in order to feed the base current of the second (or the first) replica transistor into the first bipolar transistor 212 of the bandgap reference core circuit 210. During the second switching phase, a circuit node 642 between switch 510 and resistor 516 is connected directly to the inverting input of the chopper amplifier 518.

A controlled current source 505 coupled to the output of the chopper amplifier 518 may be used by the bandgap reference core circuit 210 to provide a PTAT current ($I_{PTAT}$) that is combined, at a circuit node 622, with the NTAT current ($I_{NTAT}$) of the current source 604 controlled by the second chopper amplifier 618, the combined current flowing through resistor R4 to ground. A voltage $V_{const}$ that is highly constant over the temperature is thereby able to be obtained at the circuit node 622, which is equal to the voltage drop across resistor R4.

It is pointed out at this juncture that dynamic element matching of the controlled current sources may be performed dependently or independently of the dynamic element matching of the bipolar transistors 212, 214 and/or the replica circuits 220, 230. This is symbolized in FIGS. 5 and 6 by the different switching frequencies $f_{chop}$, $f_{DEM1}$ and $f_{DEM2}$. The different switching frequencies $f_{chop}$, $f_{DEM1}$ and $f_{DEM2}$ may be identical and phase-synchronous, identical but phase-shifted, or different from one another.

Figure 7:
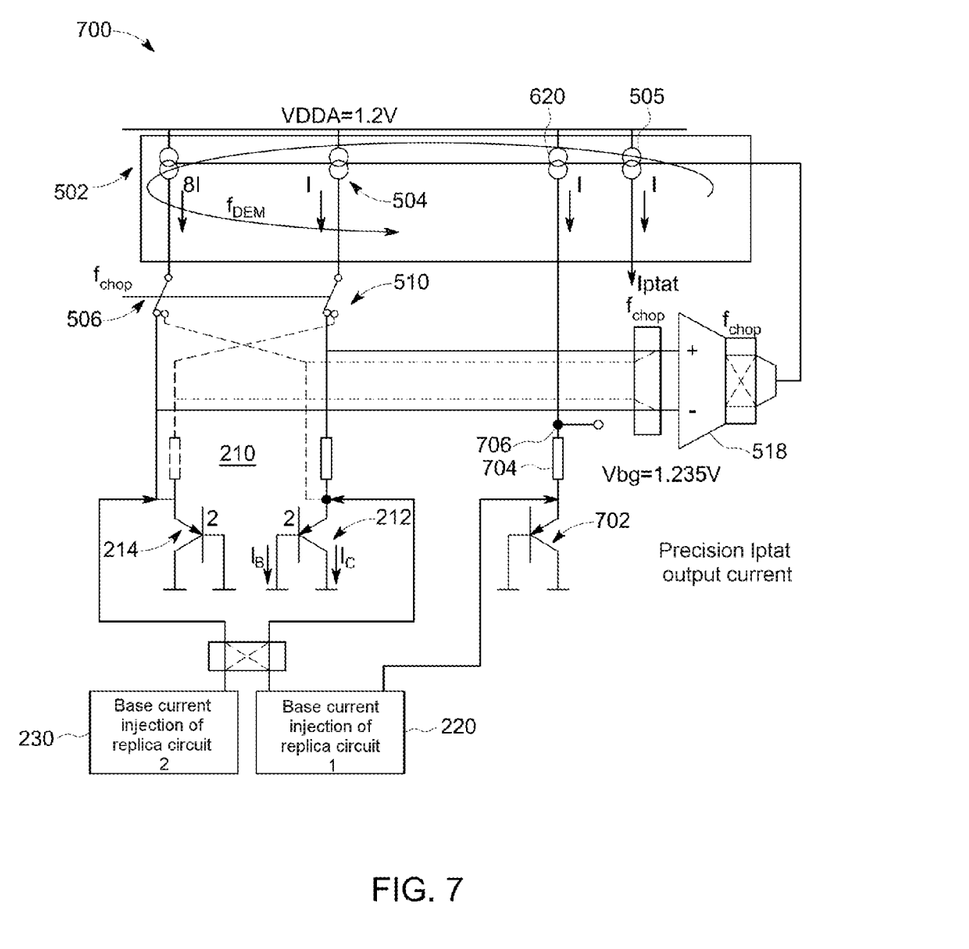
FIG. 7 shows a bandgap reference circuit according to a sixth exemplary embodiment.

FIG. 7 shows a further exemplary embodiment, illustrated in simplified form, of a bandgap reference circuit 700.

The bandgap reference circuit 700 comprises further current sources 505, 620 controlled by the chopper amplifier 518 in order to deliver a respective current $I_{PTAT}$. A pnp bipolar transistor 702 is connected between the current source 620 and ground. A resistor 704 is coupled between the emitter of the bipolar transistor 702 and the current source 620 in order to obtain a stable bandgap voltage $V_{BG}$ at the circuit node 706. The emitter of the bipolar transistor 702 may be coupled to the first or second replica circuit 220, 230 in order to couple a base current of the first or second replica bipolar transistor into the emitter of the third bipolar transistor 702.

Figure 8:
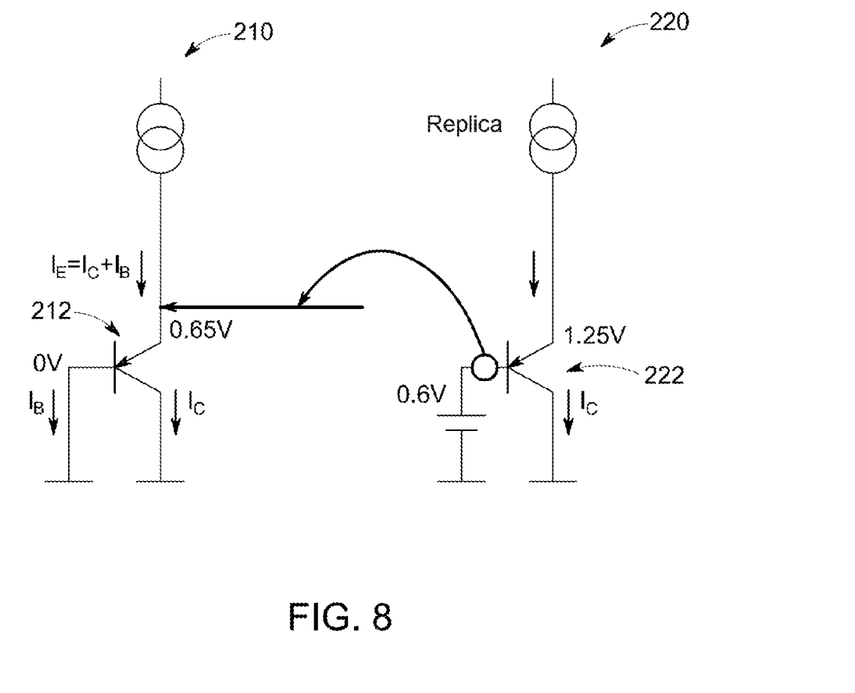
FIG. 8 shows the principle of a bandgap reference core circuit having a replica circuit.

In summary, the present disclosure thus proposes to measure individual base currents in a bandgap reference core circuit (bandgap core) 210 with replica circuits 220, 230 and to return the bias voltage or replica base currents thus obtained individually to the emitters of the pnp transistors 212, 214 of the bandgap core 210, in order to stabilize the collector current individually for each pnp transistor 212, 214 and to make it independent of common or differential β-drift effects. This proposed principle is summarized in FIG. 8.

Figure 9A:
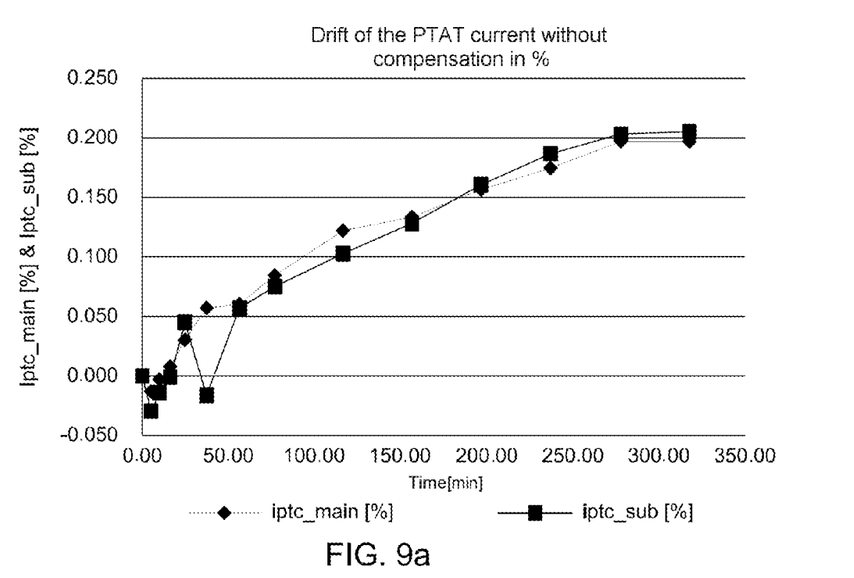
FIG. 9a shows a drift of the proportional-to-absolute-temperature (PTAT) current $I_{PTAT}$ without compensation.
Figure 9B:
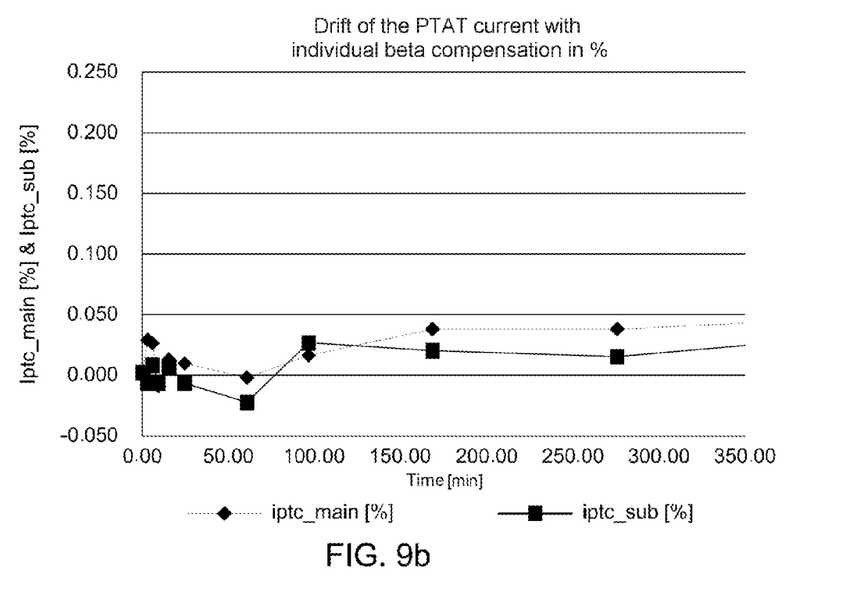
FIG. 9b shows an effect of the proposed β-drift compensation on $I_{PTAT}$.
Figure 10A:
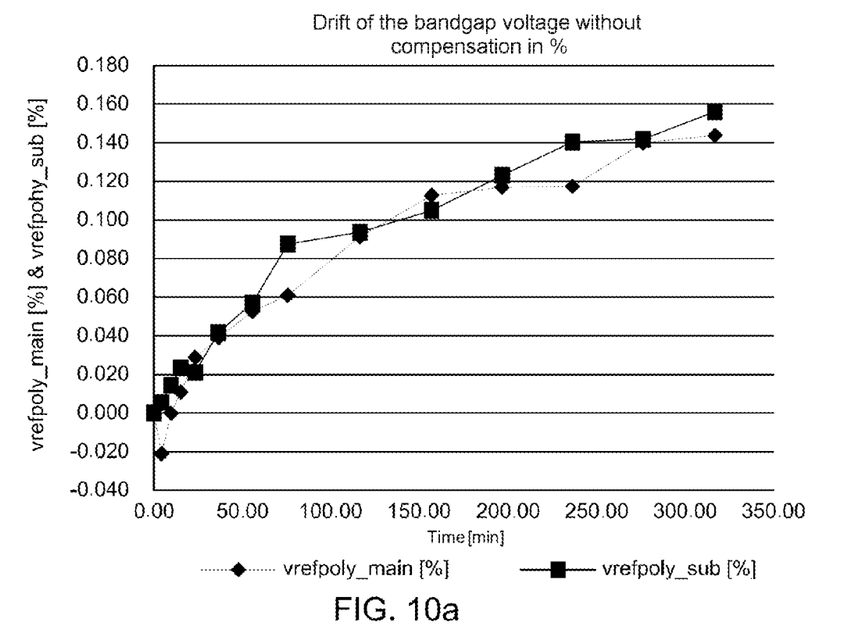
FIG. 10a shows a drift of the bandgap voltage without compensation.
Figure 10B:
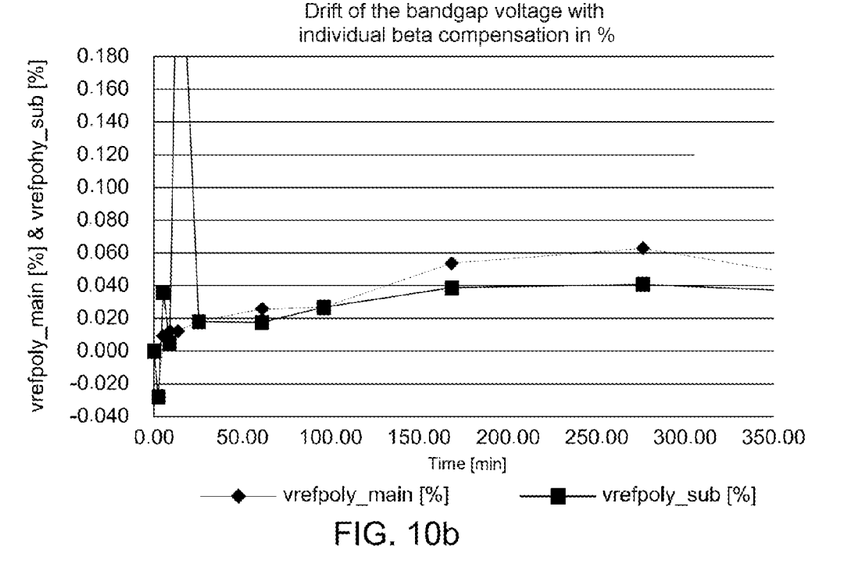
FIG. 10b shows an effect of the proposed β-drift compensation on $V_{BG}$.

FIGS. 9a, 9b, 10a, and 10b demonstrate an improvement in the stability of $I_{PTAT}$ and $V_{BG}$ in comparison with conventional bandgap reference circuits without β-drift compensation. In qualitative terms, it is possible to identify a considerable reduction in drift for each of $I_{PTAT}$ and $V_{BG}$. In particular, FIG. 9a shows a drift of the proportional-to-absolute-temperature (PTAT) current $I_{PTAT}$ without β-drift compensation, FIG. 9b shows an effect of the proposed β-drift compensation on $I_{PTAT}$, FIG. 10a shows a drift of the bandgap voltage without β-drift compensation, and FIG. 10b shows an effect of the proposed β-drift compensation on $V_{BG}$.

The aspects and features that are described together with one or more of the previously detailed examples and figures may also be combined with one or more of the other examples in order to replace an identical feature of the other example or in order to additionally introduce the feature in the other example.

Only the principles of the disclosure are illustrated by the description and drawings. Furthermore, all examples mentioned here are expressly intended in principle to serve only for illustrative purposes, so as to support the reader in understanding the principles of the disclosure and the concepts provided by the inventor(s) for further refining the technology. All statements made here relating to principles, aspects and examples of the disclosure and concrete examples thereof comprise the counterparts thereof.

A function block designated as "means for . . ." executing a specific function may relate to a circuit designed to execute a specific function. Consequently a "means for something" may be implemented as a "means designed for or suitable for something", e.g., a component or a circuit designed for or suitable for the respective task.

A block diagram may illustrate for example a rough circuit diagram that implements the principles of the disclosure. In a similar manner, a flowchart, a flow diagram, a state transition diagram, a pseudo-code and the like may represent various processes, operations or steps that are represented for example substantially in a computer-readable medium and are thus executed by a computer or processor, regardless of whether such a computer or processor is explicitly shown. Methods disclosed in the description or in the patent claims may be implemented by a component having a means for executing each of the respective steps of these methods.

It is to be understood that the disclosure of multiple steps, processes, operations or functions disclosed in the description or the claims should not be interpreted as being in the specific order, unless this is explicitly or implicitly indicated otherwise, e.g. for technical reasons. The disclosure of multiple steps or functions therefore does not limit them to a specific order, unless these steps or functions are not interchangeable for technical reasons. Furthermore, in some examples, an individual step, function, process or operation may include multiple partial steps, functions, processes or operations and/or be subdivided into them. Such partial steps may be included and be part of the disclosure of this individual step, provided that they are not explicitly excluded.

Furthermore, the claims that follow are hereby incorporated in the detailed description, where each claim may be representative of a separate example by itself. While each claim may be representative of a separate example by itself, it should be taken into consideration that—although a dependent claim may refer in the claims to a specific combination with one or more other claims—other examples may also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

What is claimed is:

1. A bandgap reference circuit comprising:
    a bandgap reference core circuit comprising:
        a first bipolar transistor having a first emitter current density and a first base-emitter voltage;
        a second bipolar transistor having a second emitter current density that is smaller than the first emitter current density and having a second base-emitter voltage;
        a resistor that is connected to an emitter of the second bipolar transistor; and
        a differential amplifier circuit that is configured to control a first emitter current and a second emitter current through the first and the second bipolar transistors, respectively, such that a sum of the second base-emitter voltage and a voltage drop across the resistor approximates the first base-emitter voltage;
    a first replica circuit comprising a first replica bipolar transistor that emulates an operating point of the first bipolar transistor, wherein the first replica circuit is configured to couple a base current of the first replica bipolar transistor to the emitter of the first bipolar transistor; and
    a second replica circuit comprising a second replica bipolar transistor that emulates an operating point of the second bipolar transistor, wherein the second replica circuit is configured to couple a base current of the second replica bipolar transistor to the emitter of the second bipolar transistor.

2. The bandgap reference circuit as claimed in claim 1, wherein the first bipolar transistor of the bandgap reference core circuit has a first base-emitter transition surface, and the second bipolar transistor of the bandgap reference core circuit has a second base-emitter transition surface that is larger than the first base-emitter transition surface.

3. The bandgap reference circuit as claimed in claim 1, wherein a first base-emitter transition surface of the first bipolar transistor of the bandgap reference core circuit corresponds to a second base-emitter transition surface of the second bipolar transistor of the bandgap reference core circuit and the bandgap reference core circuit includes a first current source that delivers the first emitter current for the first bipolar transistor and includes a second current source that delivers the second emitter current for the first bipolar transistor, wherein the second emitter current is lower than the first emitter current.

4. The bandgap reference circuit as claimed in claim 1, wherein the first bipolar transistor of the bandgap reference core circuit and the first replica bipolar transistor are configured as pnp bipolar transistors, and wherein the second bipolar transistor of the bandgap reference core circuit and the second replica bipolar transistor are configured as pnp bipolar transistors.

5. The bandgap reference circuit as claimed in claim 1, wherein;
    a base of the first replica bipolar transistor is coupled to the emitter of the first bipolar transistor of the bandgap reference core circuit and wherein the first replica circuit comprises a first MOSFET that is coupled between the first replica bipolar transistor and a current source of the first replica circuit, and
    a base of the second replica bipolar transistor is coupled to the emitter of the second bipolar transistor of the bandgap reference core circuit and wherein the second replica circuit comprises a second MOSFET that is coupled between the second replica bipolar transistor and a current source of the second replica circuit.

6. The bandgap reference circuit as claimed in claim 1, wherein the first replica circuit comprises:
    a first current mirror that is coupled to a base of the first replica bipolar transistor;
    a second current mirror that is coupled to the first current mirror, wherein the second current mirror comprises a first output that is coupled to the emitter of the first bipolar transistor of the bandgap reference core circuit, and comprises a second output that is coupled to the emitter of the first replica bipolar transistor and to a current source of the first replica circuit; and
    wherein the second replica circuit comprises:
    a third current mirror that is coupled to a base of the second replica bipolar transistor;
    a fourth current mirror that is coupled to the third current mirror, wherein the fourth current mirror comprises a third output that is coupled to the emitter of the second bipolar transistor of the bandgap reference core circuit, and comprises a fourth output that is coupled to the emitter of the second replica bipolar transistor and to a current source of the second replica circuit.

7. The bandgap reference circuit as claimed in claim 6, wherein the first and the third current mirrors are configured as NMOS current mirrors and the second and the fourth current mirrors are configured as PMOS current mirrors.

8. The bandgap reference circuit as claimed in claim 1, wherein the first and the second replica circuits and of the bandgap reference core circuit each include a current source, and the current sources of the first and the second replica circuits and of the bandgap reference core circuit are each controlled current sources configured for adjusting the first emitter current density and the second emitter current density and are each coupled to a control output of the differential amplifier circuit.

9. The bandgap reference circuit as claimed in claim 1, wherein the bandgap reference core circuit comprises:
a first current source that is controlled by the differential amplifier circuit and that is configured to deliver the first emitter current;
a second current source that is controlled by the differential amplifier circuit and that is configured to deliver the second emitter current that is lower than the first emitter current; and
a first dynamic element matching circuit that is configured to:
in a first switching phase, couple the first bipolar transistor to the first emitter current and to the first replica circuit and couple the second bipolar transistor to the second emitter current and to the second replica circuit, and,
in a second switching phase, couple the first bipolar transistor to the second emitter current and to the second replica circuit and to couple the second bipolar transistor to the first emitter current and to the first replica circuit.

10. The bandgap reference circuit as claimed in claim 9, further comprising:
a second dynamic element matching circuit that is configured to:
in a first switching phase, deliver the first emitter current by way of the first current source and to deliver the second emitter current by way of the second current source, and
in a second switching phase, deliver the first emitter current by way of the second current source and deliver the second emitter current by way of the first current source.

11. The bandgap reference circuit as claimed in claim 9, further comprising:
a further current source controlled by the differential amplifier circuit of the bandgap reference core circuit;
a third bipolar transistor; and
a further resistor that is coupled between the further current source and the emitter of the third bipolar transistor in order to obtain a bandgap voltage,
wherein the emitter of the third bipolar transistor is coupled to the first replica circuit or to the second replica circuit in order to couple a base current of the first replica bipolar transistor or the second replica bipolar transistor to the emitter of the third bipolar transistor, respectively.

12. The bandgap reference circuit as claimed in claim 9, further comprising:
a further current source that is controlled by the differential amplifier circuit of the bandgap reference core circuit and that is configured to provide a proportional-to-absolute-temperature (PTAT) current.

13. The bandgap reference circuit as claimed in claim 9, wherein the differential amplifier circuit of the bandgap reference core circuit is a chopper amplifier circuit whose inputs are coupled to different ones of the first and the second bipolar transistors of the bandgap reference core circuit in different ones of the first and the second switching phases.

14. The bandgap reference circuit as claimed in claim 9, wherein the first dynamic element matching circuit is configured to:
in the first switching phase, couple the emitter of the first bipolar transistor to a first input of a chopper amplifier and to couple an output of the chopper amplifier to a second input of the chopper amplifier, and,
in the second switching phase, to couple the emitter of the second bipolar transistor to the second input of the chopper amplifier and to couple the output of the chopper amplifier to the first input of the chopper amplifier.

15. The bandgap reference circuit as claimed in claim 14, wherein a further resistor is coupled between the output of the chopper amplifier and ground.

16. The bandgap reference circuit as claimed in claim 14, wherein the output of the chopper amplifier is coupled to a controlled current source in order to provide negative-to-absolute-temperature (NTAT) current.

17. The bandgap reference circuit as claimed in claim 16, further comprising:
a current source that is controlled by the differential amplifier circuit of the bandgap reference core circuit and that is configured to provide a proportional-to-absolute-temperature (PTAT) current; and
a further resistor connected between a circuit node and ground, wherein the NTAT current and the PTAT current flow into the circuit node and through the further resistor towards ground.

* * * * *

UNITED STATES PATENT AND TRADEMARK OFFICE
CERTIFICATE OF CORRECTION

PATENT NO. : 11,846,962 B2
APPLICATION NO. : 17/740589
DATED : December 19, 2023
INVENTOR(S) : Mario Motz et al.

It is certified that error appears in the above-identified patent and that said Letters Patent is hereby corrected as shown below:

In the Claims

Claim 9:
Column 17, Line 35, change "second replica circuit and to couple the second bipolar" to --second replica circuit and couple the second bipolar--

Signed and Sealed this
Thirteenth Day of February, 2024

Katherine Kelly Vidal
*Director of the United States Patent and Trademark Office*